United States Patent [19]

Yokomizo et al.

[11] Patent Number: 4,939,681
[45] Date of Patent: Jul. 3, 1990

[54] CIRCUIT SIMULATION METHOD FOR SEMICONDUCTOR DEVICE INCLUDING FIELD EFFECT TRANSISTORS

[75] Inventors: Goichi Yokomizo; Akio Yajima, both of Tokyo; Toshiyuki Morioka; Akihisa Maruyama, both of Kokubunji; Hirofumi Johnishi, Hachioji, all of Japan

[73] Assignee: Hitachi Ltd., Tokyo, Japan

[21] Appl. No.: 187,562

[22] Filed: Apr. 28, 1988

[30] Foreign Application Priority Data

Apr. 30, 1987 [JP] Japan .................... 62-104255

[51] Int. Cl.$^5$ ............................ G06F 15/60
[52] U.S. Cl. ............................ 364/578; 364/488; 364/489; 364/490; 371/23
[58] Field of Search ........... 364/488, 489, 490, 491, 364/578; 371/23

[56] References Cited

U.S. PATENT DOCUMENTS

| 4,656,592 | 4/1987 | Spaanenburg et al. | 364/490 |
| 4,791,593 | 12/1988 | Hennion | 364/578 |
| 4,803,636 | 2/1989 | Nishiyama et al. | 364/491 |
| 4,817,012 | 3/1989 | Cali | 364/489 |

OTHER PUBLICATIONS

Yoshio Okamura et al., "Las: Layout Pattern Analysis System with New Approach", Proc. of IEEE ICCC, 1982, pp. 308-311.
J. Yoshida et al., "Panamap-B: A Mask Verification System for Bipolar IC", 18th Design Artomation Conf. Proceedings, Jun., 1981, pp. 690-695.
S. Mori et al., "Resistance Extraction in a Hierarchical IC Artwork Verification System", Proc. of IEEE ICAD, 1985, pp. 196-198.
Steven P. McCormik, "EXCL: A Circuit Extractor for IC Designs", 21st Design Automation Conf. Proceedings, 1984, pp. 616-623.

Primary Examiner—Parshotam S. Lall
Assistant Examiner—V. N. Trans
Attorney, Agent, or Firm—Fay, Sharpe, Beall, Fagan, Minnich & McKee

[57] ABSTRACT

A circuit simulation method and apparatus for simulating the operation of semiconductor devices, including field effect transistors (FETs), on the basis of the mask layout pattern of each semiconductor device. A circuit simulation method is performed by a computer which includes a first step of determining an equivalent circuit of the semiconductor device from the mask layout patterns, and a second step of producing a signal indicative of the operation of the equivalent circuit determined by the first step. The equivalent circuit is determined by extracting resistive area patterns of the FETs and calculating resistance values of FET signal paths to obtain FET equivalent resistances. The resistive area patterns are divided into a series of rectangles which are converted to equivalent resistive elements to then be arranged so that an equivalent resistive value can be calculated.

6 Claims, 14 Drawing Sheets

☐ : SOURCE OR DRAIN REGION OF MOSFET

▨ : CHANNEL REGION OF MOSFET ($L_1$, $L_2$ : CHANNEL LENGTH)

⌐ ¬ : WIRING REGION MADE OF ALUMINUM

⊠ : CONTACT HOLE REGION $R_{12} = 1/y'_{12}$ $R_{13} = 1/y'_{13}$ $R'_{12} = R_{12} - R_{M1}$ $R'_{13} = R_{13} - R_{M2}$ $R_{M1} = \rho_C \, L_1/W_1$ $R_{M2} = \rho_C \, L_2/W_2$ $W_1, W_2$ : CHANNEL WIDTH $L_1, L_2$ : CHANNEL LENGTH $\rho_C$ : CHANNEL SHEET RESISTANCE IN ON-STATE PATTERN SERIAL : PATTERN NO.
NO. $i$ BELONGING TO
GROUP NAME
($i$)

FIG. 15A

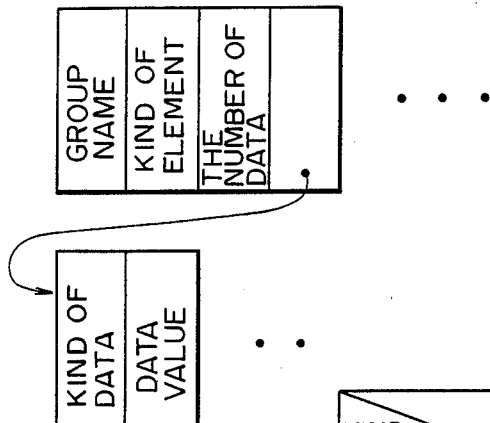

FIG. 15B

| KIND OF ELEMENT | THE NUMBER OF DATA | KIND OF DATA |
|---|---|---|
| MOSFET | 3 | P TYPE/N TYPE |
| | | REPRESENTATIVE NAME OF DEVICE CHARACTERISTICS |
| | | CHANNEL SHEET RESISTANCE |
| SOURCE/ DRAIN RESISTANCE | 2 | SHEET RESISTANCE |
| | | THE NUMBER OF RECTANGLES MAKING UP PATTERN |
| WIRING RESISTANCE | 1 | SHEET RESISTANCE |
| CONTACT RESISTANCE | 1 | RESISTANCE PER UNIT AREA |
| CAPACITANCE BETWEEN CROSSING WIRES | 2 | CAPACITANCE PER UNIT AREA |
| | | CAPACITANCE PER UNIT LENGTH |

NODE: POINT WHERE ELEMENTS ARE CONNECTED EACH OTHER

GROUP NO. : GROUP NO. OF ELEMENTS CONNECTED TO A NODE

ELEMENT NO. : ELEMENT NO. OF ELEMENT CONNECTED TO A NODE

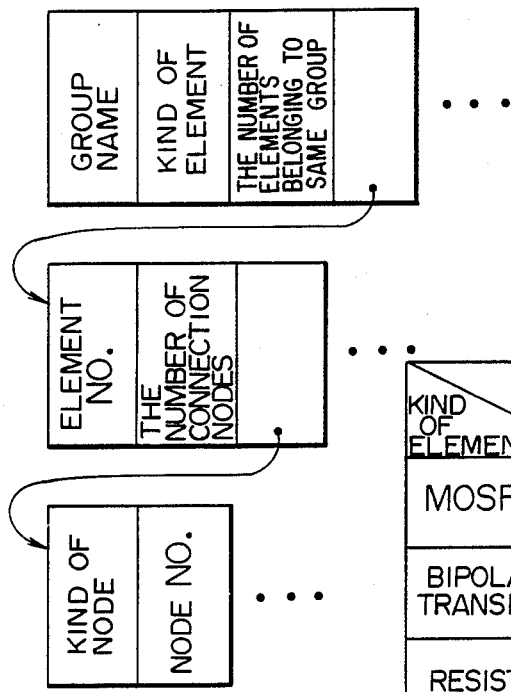

CIRCUIT SIMULATION METHOD FOR SEMICONDUCTOR DEVICE INCLUDING FIELD EFFECT TRANSISTORS

BACKGROUND OF THE INVENTION

The present invention relates to a method of simulating the operation of a semiconductor device by using the mask layout patterns thereof, and more particularly to a circuit resistance calculating method suited to calculate the resistance value of a diffused region used as the source or drain region of a metal oxide semiconductor field effect transistor (hereinafter referred to as "MOSFET").

Two methods have been known for calculating the resistance value of a resistive area pattern (that is, a pattern showing a resistive area). One of the methods is called a potential method, in which the two-dimensional potential distribution in the resistive area pattern is determined through numerical analysis techniques, to obtain the resistance value of the pattern. (Refer to an article entitled "LAS: LAYOUT PATTERN ANALYSIS SYSTEM WITH NEW APPROACH" by Yoshio Okamura et al., Proc. of IEEE ICCC, 1982, pages 308 to 311, and "EXCL: A Circuit Extractor for IC Designs" by Steven P. McCormik, 21st Design Automation Conf. Proceedings, pages 616 to 623, 1984). The other methods are called a center line method or rectangular decomposition method, in which the direction of current flowing through a resistive area is first determined, and the resistance value of the resistive area is calculated from the length of the area along the current direction and the width of the area in a direction perpendicular to the current direction. (Refer to an article entitled "A MASK VERIFICATION SYSTEM FOR BIPOLAR IC" by J. Yoshida et al., 18th Design Automation Conf. Proceedings, pages 690 to 695, June, 1981 and "Resistance Extraction in a Hierachical IC Artwork Verification System" by S. Mori et al., Proc. of IEEE ICCAD, 1985, pages 196 to 198).

The potential method is applicable to the calculation of the resistance value of the diffused source or drain region of a MOSFET, but has the following drawback. That is, a large storage capacity is required for the calculation, and a long calculation time is necessary. Thus, a cost for calculating resistance values of a multiplicity of resistive areas indicated by the mask pattern of an LSI becomes very high. While, the center line method is and the rectangular decomposition method are low in calculation cost, but have a disavantage that it is impossible to calculate the resistance value of a resistive area contiguous to a high-resistance area far larger in resistance value than the resistive area, that is, it is impossible to calculate the resistance value of the diffused source or drain region of a MOSFET contiguous to a channel having a large resistance value.

SUMMARY OF THE INVENTION

It is an object of the present invention to provide a circuit simulation method for a semiconductor device capable of determining the resistance value of the diffused source or drain region of a MOSFET efficiently.

In order to attain the above object, according to the present invention, there is provided a circuit simulation method for simulating the operation of a semiconductor device including field effect transistors on the basis of a plurality of mask layout patterns corresponding to the semiconductor device, with the aid of an apparatus which method includes a first step of determining an equivalent circuit of the semiconductor device from the mask layout patterns and a second step of producing a signal indicative of the operation of the equivalent circuit determined by the first step. The first step includes the sub-steps of: extracting a resistive area pattern indicative of a first diffused region of a first FET serving as the source or drain region thereof, a first channel pattern indicative of the channel of the first FET and a second channel pattern indicative of the channel of a second FET from the mask layout patterns, in a case where the first diffused region of the first FET is also used as a first diffused region of the second FET serving as the source or drain region thereof; calculating a first resistance value indicative of the equivalent resistance between a contact hole provided on the first diffused region and a first side where the channel of the first FET is kept in contact with a second diffused region of the first FET serving as the drain or source region thereof, and a second resistance value indicative of the equivalent resistance between the contact hole and a second side where the channel of the second FET is kept in contact with a third diffused region of the second FET serving as the drain or source region thereof, from the resistive area pattern, the first and second channel patterns, the sheet resistance of the first diffused region and the sheet resistance of each of the channels of the first and second FET's put in an ON-state, under a condition that each of the first and second sides has a uniform potential and the potential of the first side is equal to the potential of the second side; calculating a third resistance value indicative of the equivalent resistance of the channel of the first FET and a fourth resistance value indicative of the equivalent resistance of the channel of the second FET from the length and width of each of the channels of the first and second FET's; and calculating the difference between the first and third resistance values to obtain the equivalent resistance of the first diffused area between the contact hole and the channel of the first FET, and calculating the difference between the second and fourth resistance values to obtain the equivalent resistance of the first diffused area between contact hole and the channel of the second FET.

BRIEF DESCRIPTION OF THE DRAWINGS

FIG. 15A is a schematic diagram showing an example of the format of data for indicating circuit parameters per unit dimension.

FIG. 15B is a schematic diagram showing an example of data shown in FIG. 15A.

FIG. 18A is a schematic diagram showing an example of the format of data with respect to nodes connected to each element. FIG. 18B is a schematic diagram showing an example of data shown in FIG. 18A.

DESCRIPTION OF THE PREFERRED EMBODIMENT

An embodiment of the present invention will be explained below, with reference to the drawings.

Figure 1:
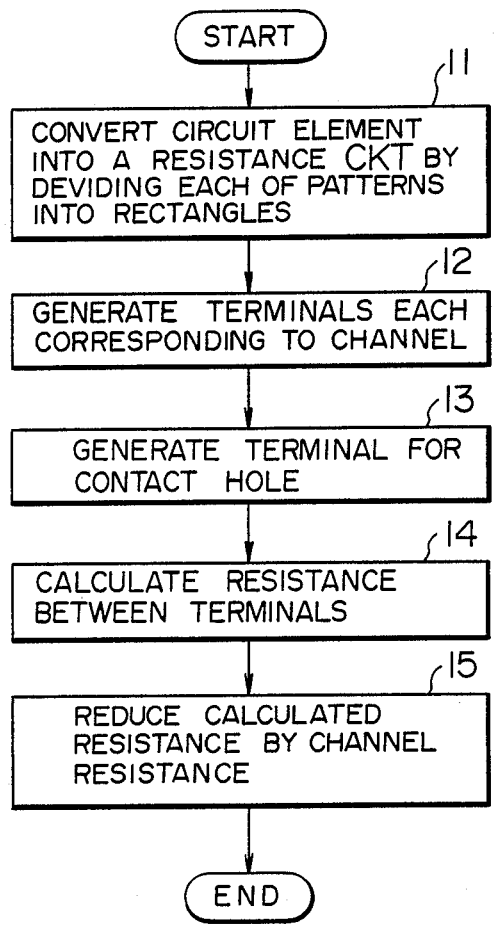
FIG. 1 is a flow chart showing steps included in a method of determining the resistance value of a diffused source or drain region of a MOSFET in accordance with the present invention.
Figure 6:
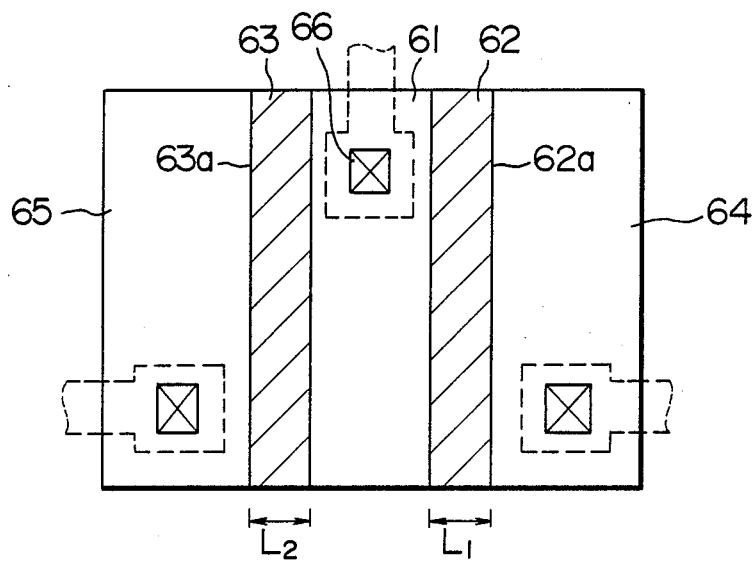
FIG. 6 is a schematic diagram showing a resistive area pattern indicative of a diffused source or drain region of a MOSFET, channel patterns each indicative of the channel of MOSFET, a contact hole pattern and other patterns indicative of related elements, which are all used in an embodiment of the present invention.

FIG. 1 shows steps included in a method of determining the resistance value of a diffused region used as the source or drain region of each of first and second MOSFET's in accordance with the present invention. As shown in FIG. 1, the above method includes steps 11 to 15. In the step 11, a resistive area pattern 61 shown in FIG. 6 for indicating the diffused source or drain region and channel patterns 62 and 63 shown in FIG. 6 for indicating channels of the first and second MOSFET's, are all divided into rectangles, and each rectangle is converted into a resistive element. Further, the resistive elements thus obtained are connected to one another in accordance with the positional relation among the rectangles, to form a resistance circuit. In the step 12, nodes on a side 62a shown in FIG. 6 for indicating the interface between the channel pattern 62 and another diffused region of the first MOSFET used as the drain or source region thereof and nodes on a side 63a shown in FIG. 6 for indicating the interface between the channel pattern 63 and another diffused region of the second MOSFET used as the drain or source region thereof are considered to have the same potential. Thus, nodes on each side are connected to a single terminal. In the step 13, attention is paid to a rectangle including a contact hole 66 which is formed on the resistive area pattern 61 as shown in FIG. 6, and a node which is connected to a resistive element corresponding to the above rectangle, is considered to be a terminal. In step 14, the resistance value between the terminal corresponding to the contact hole and the terminal corresponding to each of the sides 62a and 63a is determined. In the step 15, the resistance value between the contact hole and each channel, that is, the resistance value of the diffused source or drain region is determined by subtracting the resistance value of channel from the resistance value obtained in the step 14. The steps 11, 12, 13, 14 and 15 are processed in the order described.

Figure 2:
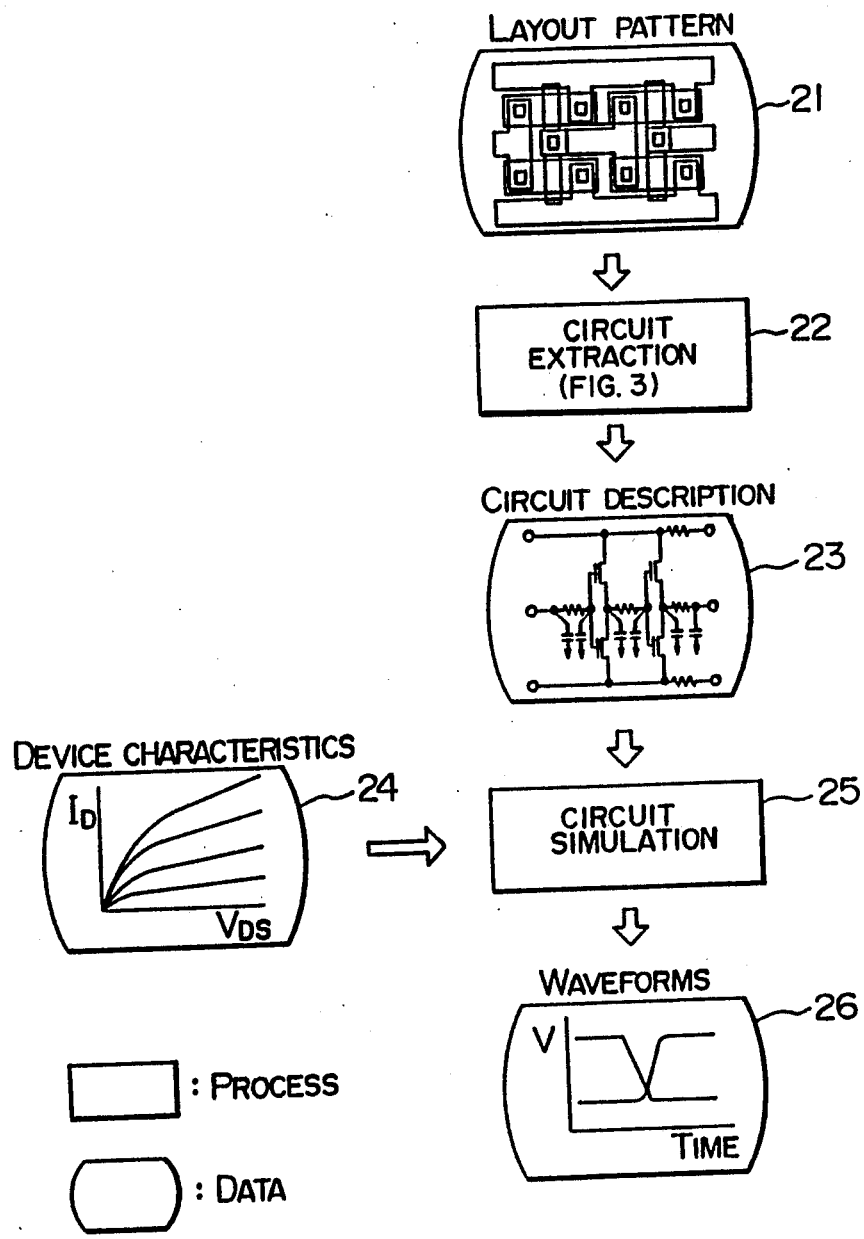
FIG. 2 is a block diagram showing a circuit characteristic inspecting system which utilizes a method of determining the resistance value of a diffused source or drain region of a MOSFET in accordance with present invention.

FIG. 2 shows a circuit characteristic inspecting system which utilizes a method of determining the resistance value of a diffused source or drain region of a MOSFET in accordance with the present invention. As shown in FIG. 2, the above system includes a circuit extraction unit 22 and a circuit simulator 25, to obtain voltage or current waveforms 26 from a mask layout pattern 21 of semiconductor device and device characteristics 24. The process carried out by the circuit extraction unit 22 comprises the method of the present invention for determining the resistance value of a diffused source or drain region of a MOSFET. The circuit extraction unit 22 produces circuit description data 23 from the layout pattern 21 by using the resistance value calculating method according to the present invention, and the circuit simulator 25 produces the voltage or current waveforms 26 by using the device characteristics 24 and the circuit description data 23.

Figure 3:
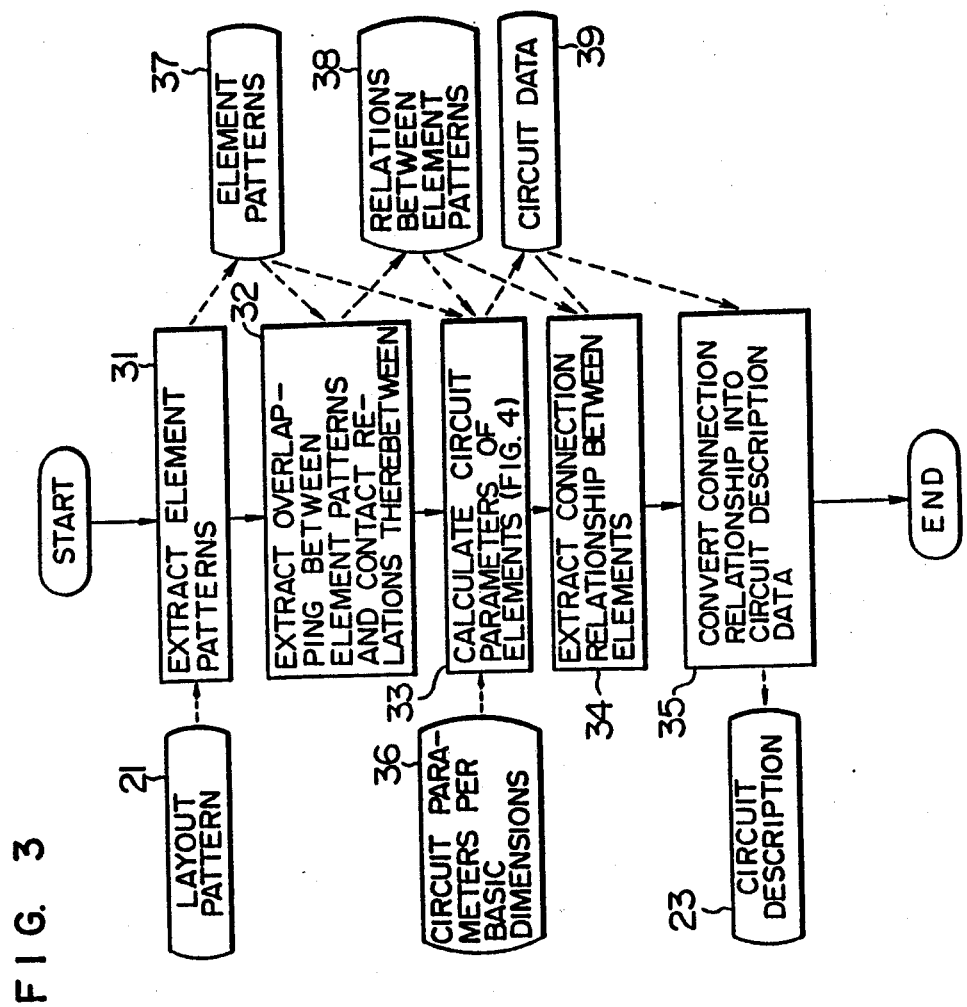
FIG. 3 is a flow chart showing the steps of processing carried out by the circuit extraction unit of FIG. 2.

FIG. 3 is a flow chart showing the steps of processing carried out by the circuit extraction unit. The process carried out in step 33 of FIG. 3 for calculating circuit parameters of the elements, comprises the method of the present invention for determining the resistance value of a diffused source or drain region of a MOSFET.

Figure 4:
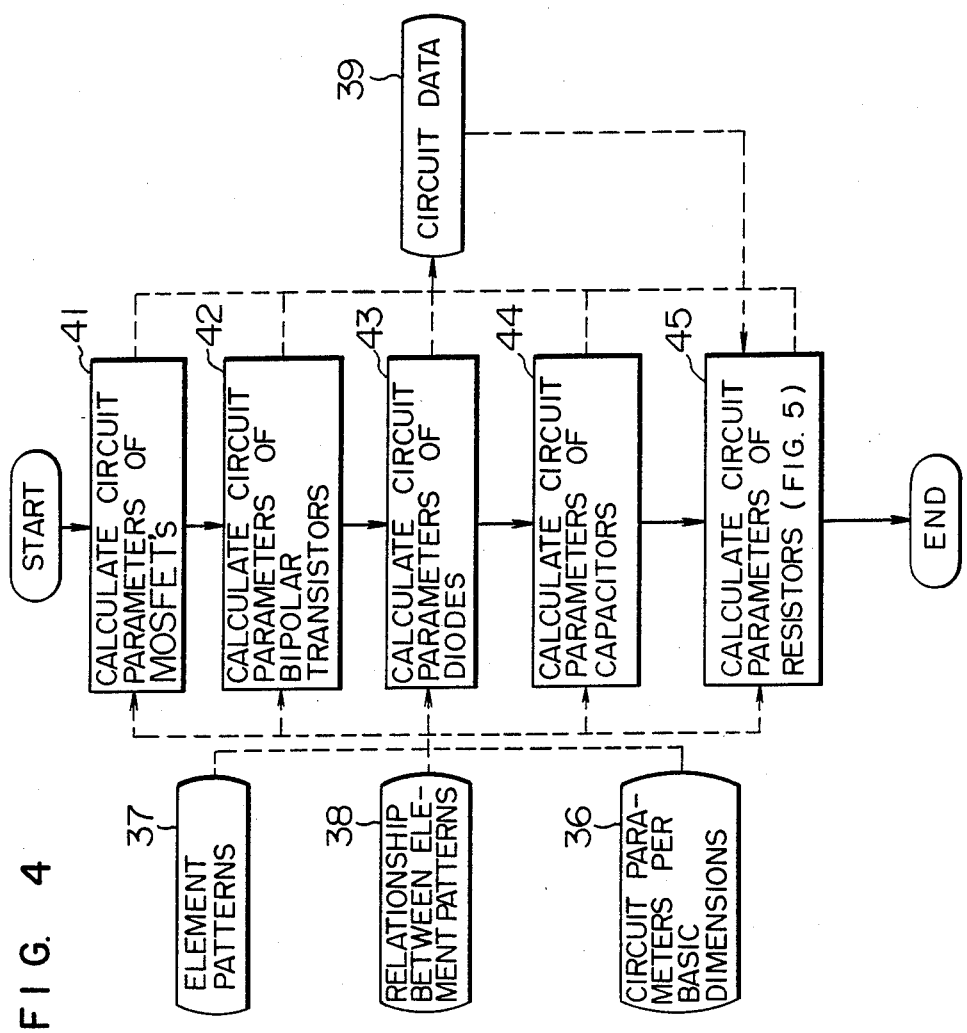
FIG. 4 is a flow chart which shows steps for calculating circuit parameters of elements.

FIG. 4 is a flow chart showing the processing procedure of the step 33 of FIG. 3 for calculating circuit parameters. The process carried out in step 45 of FIG. 4 for calculating circuit parameters of resistors comprises the method of the present invention for determining the resistance value of a diffused source or drain region of a MOSFET.

Figure 5:
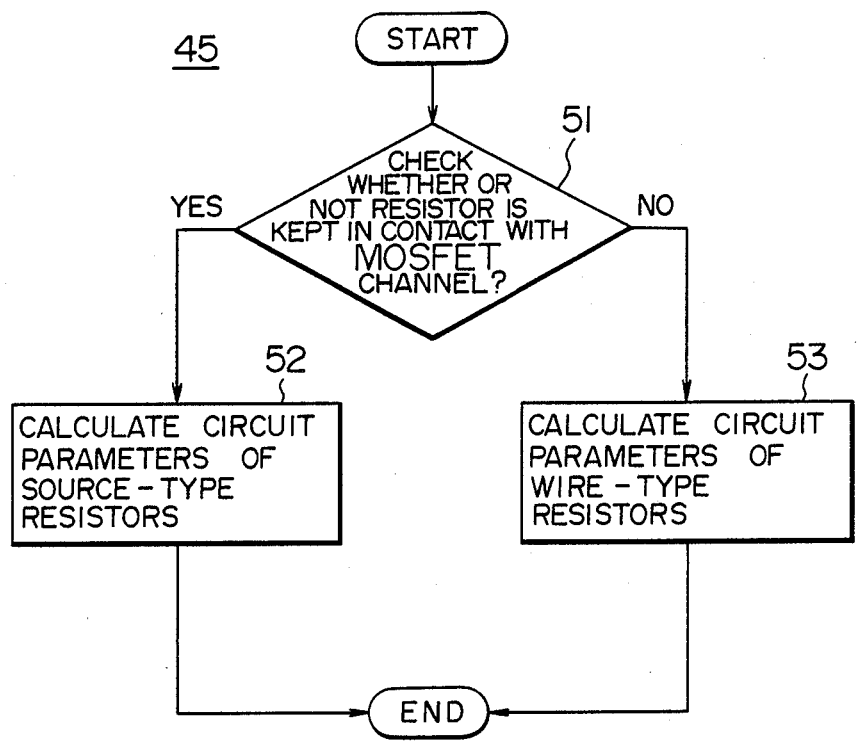
FIG. 5 is a flow chart which shows steps for calculating circuit parameters of resistors.

FIG. 5 is a flow chart showing the processing procedure of the step 45 of FIG. 4 for calculating circuit parameters of resistors. The process carried out in step 52 of FIG. 5 for calculating circuit parameters of source-type resistors, comprises the method of present invention for determining the resistance value of a diffused source or drain region of a MOSFET.

The processing shown in FIGS. 2 to 5 is described in the above-referred articles and many other publications.

FIG. 6 is a schematic diagram showing a resistive area pattern 61 for indicating a diffused source or drain region of a MOSFET, channel patterns 62, 63 for indicating the channels of two MOSFET's, a pattern 66 for indicating a contact hole, and other patterns for indicating related elements, which are all used in the present embodiment. In other words, FIG. 6 is a plan view showing a portion of a semiconductor device.

Now, explanation will be made of the present embodiment, that is, a case where a method of determining the resistance value of a diffused source or drain region of a MOSFET in accordance with the present invention is carried out for the semiconductor device of FIG. 6.

Figure 7:
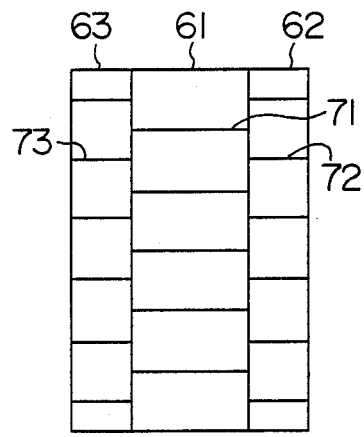
FIG. 7 is a schematic diagram showing an assembly of rectangles obtained by carrying out the processing of a first step of the method of determining the resistance value of a diffused source or drain region of a MOSFET in accordance with the present invention, for a resistive area pattern indicative of the diffused source or drain region and two channel patterns.
Figure 8:
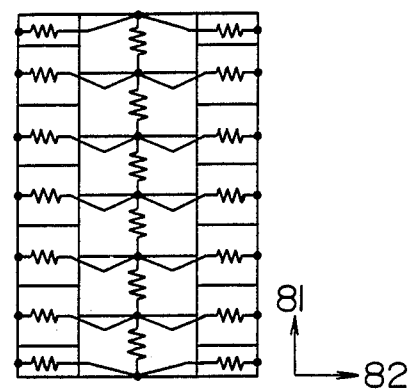
FIG. 8 is a schematic diagram showing a resistance circuit given by the rectangle arrangement of FIG. 7.

The processing of the step 11 of FIG. 1 which is a flow chart showing a method of determining the resistance value of a diffused source or drain of a MOSFET, is carried out for the resistive area pattern 61 and channel patterns 62 and 63 to obtain an assembly of rectangles shown in FIG. 7. In more detail, each of the patterns 61, 62 and 63 is divided along the lengthwise direction of the resistive area pattern 61 into a plurality of rectangles. Thus, as shown in FIG. 8, only one directional resistive component contributing to the characteristics of the semiconductor device in each rectangle are taken into consideration, and hence resistance value calculation is carried out efficiently. As shown in FIG. 7, a boundary 71 between adjacent rectangles included in the resistive area pattern 61 is deviated from each of a boundary 72 between adjacent rectangles included in the channel pattern 62 and a boundary 73 between adjacent rectangles included in the channel pattern 63. This is because resistive elements corresponding to the rectangles can be readily connected to one another in forming a resistance circuit. The resistive elements are connected to one another in accordance with the positional relation among the rectangles, to form a resistance circuit shown in FIG. 8. The resistance R of each resistive element corresponding to one rectangle is given by the following equation:

$$R = \rho L/W \quad (1)$$

where $\rho$ is the sheet resistance of a semiconductor region indicated by one rectangle, L the length of one rectangle (in more detail, the length of one rectangle included in the resistive area pattern 61 in the lengthwise direction 81 of the pattern 61, and the length of one rectangle included in the channel patterns 62 and 63 in a direction 82 perpendicular to the lengthwise direction 81 of the pattern 61), and W the width of one rectangle (in a direction perpendicular to the direction of the length thereof). That is, only one directional resistive component contributing to the characteristics of the semiconductor device are taken into consideration.

Figure 9:
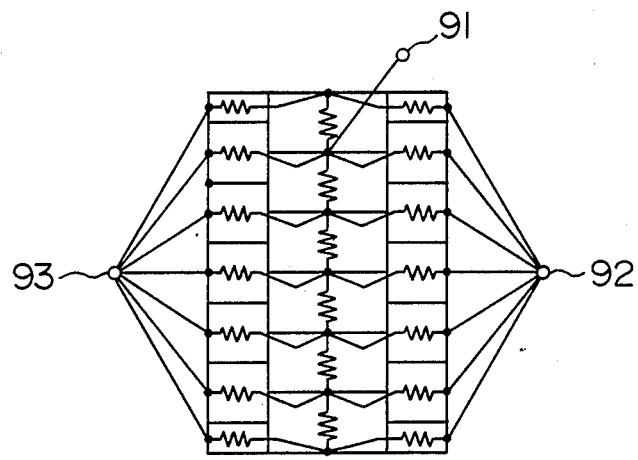
FIG. 9 is a schematic diagram showing a resistance circuit obtained as a result of the processing of second and third steps of the method of determining the resistance value of a diffused source or drain region of a MOSFET in accordance with the present invention.

FIG. 9 shows a resistance circuit which is obtained by carrying out the processing of the steps 12 and 13 of FIG. 1 for the resistance circuit shown in FIG. 8. Referring to FIG. 9, terminals 92 and 93 are formed by the processing of the step 12, and a terminal 91 is formed by the processing of the step 13.

Now, explanation will be made of an operation principle which is used when the processing of the step 14 of FIG. 1 is carried out for the resistance circuit shown in FIG. 9. Now, let us consider a case where the node analysis method is used for the resistance circuit shown in FIG. 9. When a node voltage vector, a current vector indicative of currents flowing from the outside of the resistance circuit to nodes, and an admittance matrix are expressed by V, I and Y, respectively, we can obtain the following equation:

$$YV = I \quad (2)$$

where $$Y = \begin{bmatrix} y_{11}, y_{12}, \dots, y_{1n} \\ y_{21}, y_{22}, \dots, y_{2n} \\ - \\ - \\ y_{n1}, y_{n2}, \dots, y_{nn} \end{bmatrix}, V = \begin{bmatrix} v_1 \\ v_2 \\ - \\ - \\ v_n \end{bmatrix}, I = \begin{bmatrix} i_1 \\ i_2 \\ - \\ - \\ i_n \end{bmatrix}$$

Further, $v_i$ indicates the voltage of the i-th node, and $i_i$ a current flowing from the outside to the i-th node.

Now, let us use nodes connected to the terminals 91, 92 and 93, as the first, second and third nodes, respectively. The node voltage V, the current vector I and the admittance matrix Y can be expressed as follows:

$$Y = \begin{bmatrix} Y_{11} & Y_{12} \\ Y_{21} & Y_{22} \end{bmatrix}, V = \begin{bmatrix} V_1 \\ V_2 \end{bmatrix}, I = \begin{bmatrix} I_1 \\ I_2 \end{bmatrix}$$

where $$Y_{11} = \begin{bmatrix} y_1 y_{12} y_{13} \\ y_{21} y_{22} y_{23} \\ y_{31} y_{32} y_{33} \end{bmatrix}, Y_{12} = \begin{bmatrix} y_{14} y_{15} \dots y_{1n} \\ y_{24} y_{25} \dots y_{2n} \\ y_{34} y_{35} \dots y_{3n} \end{bmatrix},$$

$$Y_{21} = \begin{bmatrix} y_{41} y_{42} y_{43} \\ y_{51} y_{52} y_{53} \\ - \\ - \\ y_{n1} y_{n2} y_{n3} \end{bmatrix}, Y_{22} = \begin{bmatrix} y_{44} y_{45} \dots y_{4n} \\ y_{54} y_{55} \dots y_{5n} \\ - \\ - \\ y_{n4} y_{n5} \dots y_{nn} \end{bmatrix},$$

$$V_1 = \begin{bmatrix} v_1 \\ v_2 \\ v_3 \end{bmatrix}, V_2 = \begin{bmatrix} v_4 \\ v_5 \\ \cdot \\ \cdot \\ v_n \end{bmatrix}, I_1 = \begin{bmatrix} i_1 \\ i_2 \\ i_3 \end{bmatrix}, I_2 = \begin{bmatrix} i_4 \\ i_5 \\ \cdot \\ \cdot \\ i_n \end{bmatrix}$$

When the current vector I is divided into two parts $I_1$ and $I_2$ as mentioned above, the current vector $I_2$ is the zero vector (that is, $I_2 = 0$), because the fourth and following nodes are not connected to the outside.

Thus, we can obtain the following equations:

$$\begin{bmatrix} Y_{11} & Y_{12} \\ Y_{21} & Y_{22} \end{bmatrix} \begin{bmatrix} V_1 \\ V_2 \end{bmatrix} = \begin{bmatrix} I_1 \\ I_2 \end{bmatrix} = \begin{bmatrix} I_1 \\ 0 \end{bmatrix}$$

$$Y_{21}V_1 + Y_{22}V_2 = 0$$

That is, $V_2 = -Y^{-1}{}_{22}Y_{21}V_1$ where $Y^{-1}{}_{22}$ indicates the inverse matrix of $Y_{22}$.

Further, we can obtain the following equation:

$$Y_{11}V_1 + Y_{12}V_2 = I_1$$

This equation can be rewritten as follows:

$$[Y_{11} - Y_{12}Y^{-1}{}_{22}Y_{21}]V_1 = I_1$$

Now, let us use a matrix Y' given by the following equation:

$$Y' = \begin{bmatrix} y_{11}'y_{12}'y_{13}' \\ y_{21}'y_{22}'y_{23}' \\ y_{31}'y_{32}'y_{33}' \end{bmatrix} = Y_{11} - Y_{12}Y_{22}^{-1}Y_{21}$$

The resistance circuit of FIG. 9 is formed of only linear resistors. Hence, the reciprocity theorem is applicable to this resistance circuit. Thus, a relation $y'_{ij}=y'_{ji}$ (where i=1, 2 and 3, j=1, 2 and 3) is obtained, and $y'_{ij}$ indicates the equivalent conductance between the i-th node and the j-th node. In more detail, $y'_{12}$ indicates the equivalent conductance between the first node connected to the terminal 91 which corresponds to the contact hole, and the second node connected to the terminal 92 which corresponds to the channel 62. Further, $y'_{13}$ indicates the equivalent conductance between the first node connected to the terminal 91 which corresponds to the contact hole, and the third node connected to the terminal 93 which corresponds to the channel 63. Thus, the resistance circuit of FIG. 9 is converted into a resistance circuit shown in FIG. 10, since resistance is given by the inverse of conductance.

Figure 10:
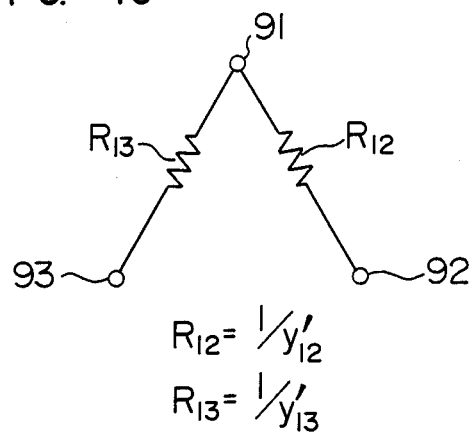
FIG. 10 is a circuit diagram showing resistance values between a terminal provided for a contact hole and terminals provided for two channels.
Figure 11:
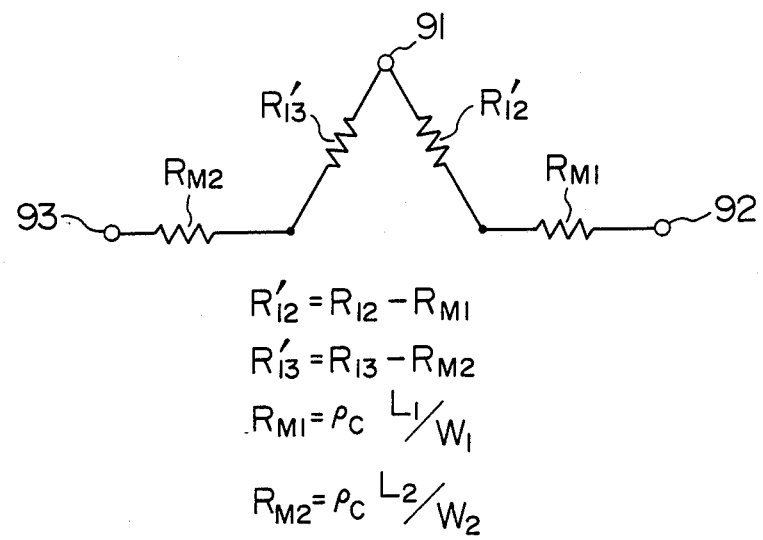
FIG. 11 is a circuit diagram showing the fact that the resistance value between a terminal provided for a contact hole and a terminal provided for a channel is given by the sum of the resistance value of the channel and the resistance value between the channel and the contact hole.

When the processing of the step 15 of FIG. 1 is carried out for the resistance circuit of FIG. 10, that is, the resistance of a channel is subtracted from the resistance between the terminal 91 corresponding to the contact hole and the terminal 92 or 93 corresponding to the channel 62 or 63, the resistance $R'_{12}$ between the contact hole and the channel 62 and the resistance $R'_{13}$ between the contact hole and the channel 63 can be obtained as shown in FIG. 11.

Figure 12:
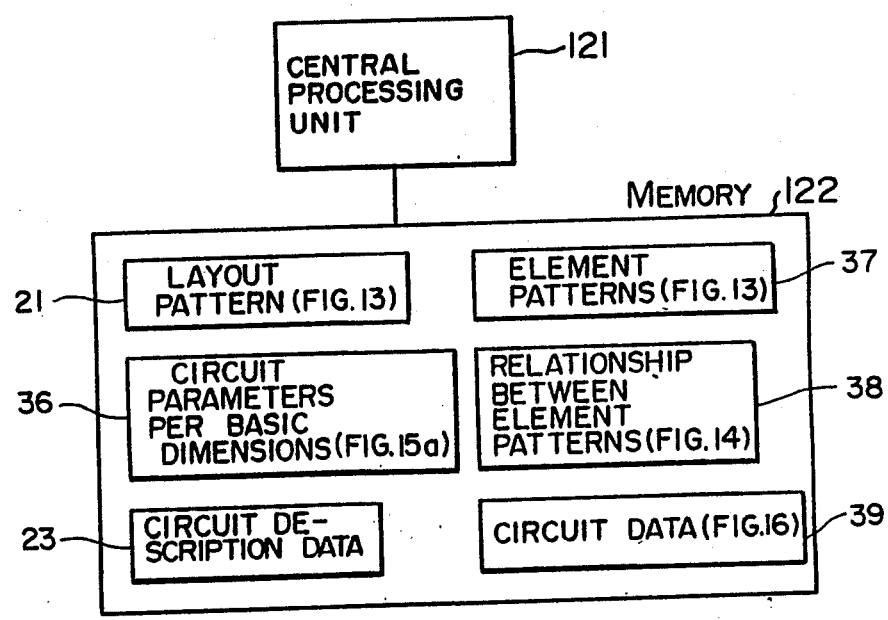
FIG. 12 is a block diagram showing the construction of a circuit extraction unit for carrying out a method of determining the resistance value of a diffused source or drain region of a MOSFET in accordance with the present invention.
Figure 13:
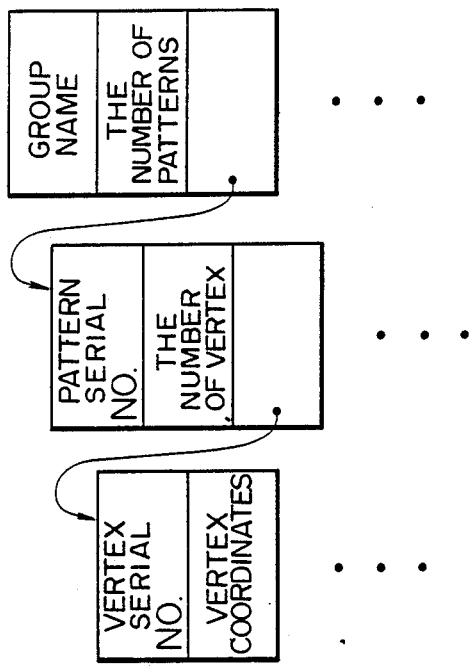
FIG. 13 is a schematic diagram showing an example of the format of each of a layout pattern and element pattern data.
Figure 14:
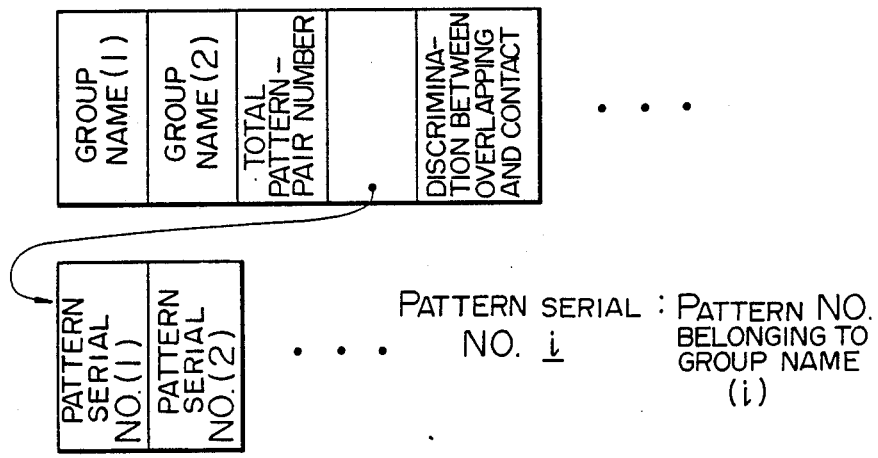
FIG. 14 is a schematic diagram showing an example of the format of data for indicating the positional relation between element patterns.
Figure 16:
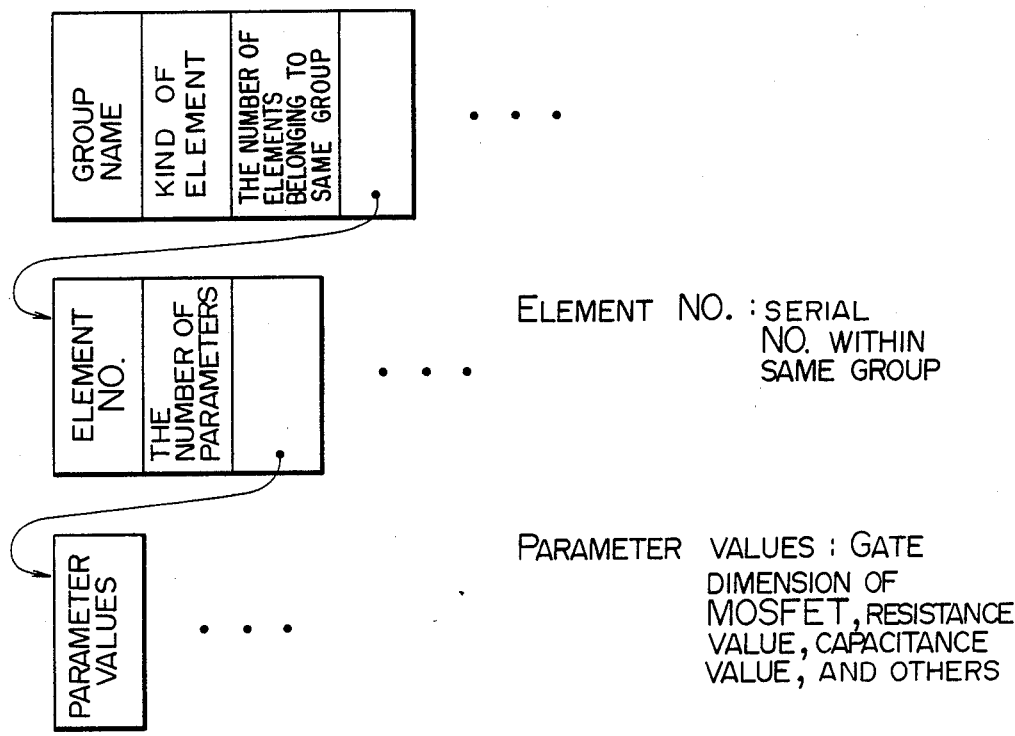
FIG. 16 is a schematic diagram showing an example of the format of data for indicating those circuit parameters of elements which are contained in the circuit data of FIG. 12.
Figure 17:
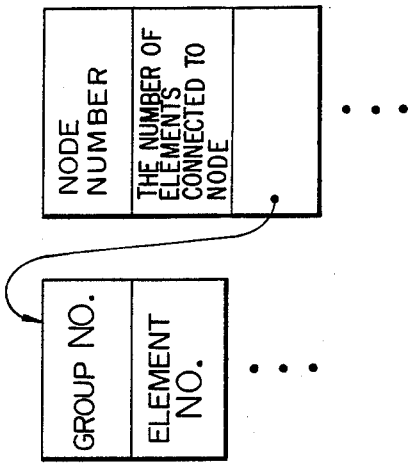
FIG. 17 is a schematic diagram showing an example of the format of that data with respect to elements connected to the same node which is contained in the circuit data of FIG. 12.

FIG. 12 shows a possible construction of the circuit extraction unit 22 which could utilize the method of the present invention. A central processing unit 121 is connected to a memory 122 to execute a predetermined program held in the memory. The execution of the instructions held in memory 122 by the central processing unit 121, performed upon the inputted data in the form of a layout pattern 21 results in an equivalent resistive circuit description of a MOSFET in accordance with the method of the present invention. An example of the format of the layout pattern 21 shown in FIG. 12 and an example of the format of the element patterns 37 shown in FIG. 12 are shown in FIG. 13. It is to be noted that the layout pattern 21 and the element patterns 37 can be expressed by the same format. An example of the format of a memory region 38 shown in FIG. 12 for storing a relationship between element patterns is shown in FIG. 14. An example of the format of a memory region 36 shown in FIG. 12 for storing circuit parameters per basic dimensions is shown in FIG. 15A and an example of data shown in FIG. 15A is shown in FIG. 15B. Further, FIG. 16 shows an example of the format for expressing those circuit parameters of elements which are contained in the circuit data 39 of FIG. 12. FIG. 17 shows an example of the format for expressing that data with respect to elements connected to the same node which is contained in the circuit data of FIG. 12. FIG. 18A shows an example of the format for expressing data with respect to nodes connected to each element. FIG. 18B shows an example of data shown in FIG. 18A.

In the above, the present invention has been explained in detail, with respect to an embodiment thereof. According to the present invention, the resistance value of a diffused source or drain region of a MOSFET which cannot be calculated by the center line method, can be determined at a calculation cost less than one-tenth the calculation cost of the potential method.

We claim:

1. A circuit simulation method performed by a computer executing a stored program for simulating an operation of a semiconductor device including field effect transistors (FETs) on a basis of a plurality of mask layout patterns corresponding to the semiconductor device, the circuit simulation method comprising:
    a first step of determining an equivalent circuit of the semiconductor device from the mask layout patterns; and
    a second step of producing a signal indicative of the operation of the equivalent circuit determined by the first step,
    wherein the first step comprises sub-steps of:
    extracting a resistive area pattern indicative of a first diffused region of a first FET serving as a source or drain region thereof, a first channel pattern indicative of a channel of the first FET and a second channel pattern indicative of a channel of a second FET, from the mask layout patterns, in a case where the first diffused region of the first FET is also used as a first diffused region of the second FET serving as a source or drain region thereof;
    calculating a first resistance value indicative of an equivalent resistance between a contact hole provided on the first diffused region and a first side where the channel of the first FET is kept in contact with a second diffused region of the first FET serving as the drain or source region thereof, and a second resistance value indicative of an equivalent resistance between the contact hole and a second side where the channel of the second FET is kept in contact with a second diffused region of the second FET serving as a drain or source region thereof, from the resistive area pattern, the first and second channel patterns, a sheet resistance of the first diffused region and a sheet resistance of each of the channels of the first and second FETs put in an ON-state, under a condition that each of the first and second sides has a uniform potential and the potential of the first side is equal to the potential of the second side;
    calculating a third resistance value indicative of an equivalent resistance of the channel of the first FET and a fourth resistance value indicative of an equivalent resistance of the channel of the second FET, from the length and width of each of the channels of the first and second FETs; and
    calculating a difference between the first and third resistance values to obtain the equivalent resistance between a contact hole and the channel of the first FET, and calculating a difference between the second and fourth resistance values to obtain the equivalent resistance between the contact hole and the channel of the second FET.

2. A circuit simulation method according to claim 1, wherein the first step comprises sub-steps of: dividing each of the resistive area pattern, the first channel pattern and the second channel pattern into a plurality of rectangles; converting each of the rectangles into an equivalent resistive element; connecting resistive elements thus obtained to each other in accordance with a positional relation between the rectangles; uniting those nodes of resistive elements which correspond to the first side, and those nodes of resistive elements which correspond to the second side, into the first and second terminals, respectively, on the premise that the nodes corresponding to the first and second sides have the same potential; specifying a connection node of a resistive element converted from the rectangles located nearest to the contact hole, as a third terminal; and calculating the resistance between the third terminal and the first terminal and the resistance between the third terminal and the second terminal, to obtain the first and second resistance values, respectively.

3. A circuit simulation system for simulating an operation of a semiconductor device including field effect transistors (FETs) on a basis of a plurality of mask layout patterns corresponding to the semiconductor device, comprising:

first means for determining an equivalent circuit of the semiconductor device from the mask layout patterns; and second means for producing a signal indicative of an operation of the equivalent circuit determined by the first means, wherein the first means comprises:

means for extracting a resistive area pattern indicative of a first diffused region of a first FET serving as a source or drain region thereof, a first channel region indicative of a channel of the first FET and a second channel region indicative of a channel of a second FET from the mask layout patterns, in a case where the first diffused region of the first FET is also used as a first diffused region of the second FET serving as a source or drain region thereof;

means for calculating a first resistance value indicative of an equivalent resistance between a contact hole provided on the first diffused region and a first side where the channel of the first FET is kept in contact with a second diffused region of the first FET serving as the drain or source region thereof, and a second resistance value indicative of the equivalent resistance between the contact hole and a second side where the channel of the second FET is kept in contact with a second diffused region of the second FET serving as the drain or source region thereof, from the resistive area pattern, the first and second channel patterns, a sheet resistance of the first diffused region and a sheet resistance of each of the channels of the first and second FETs put in an ON-state, under a condition that each of the first and second sides has a uniform potential and the potential of the first side is equal to the potential of the second side;

means for calculating a third resistance value indicative of the equivalent resistance of the channel of the first FET and a fourth resistance value indicative of the equivalent resistance of the channel of the second FET, from a length and width of each of the channels of the first and second FETs; and means for calculating a difference between the first and third resistance values to obtain the equivalent resistance between the contact hole and the channel of the first FET, and for calculating a difference between the second and fourth resistance values to obtain the equivalent resistance between the contact hole and the channel of the second FET.

4. A circuit extraction method performed by a computer executing a stored program for determining an equivalent resistive circuit of a mask layout pattern of a semiconductor device, the equivalent resistive circuit to be used as input data of an associated circuit simulator for simulating an operation of the semiconductor device, the circuit extraction method comprising the steps of:

a first step of extracting resistive area patterns indicative of diffused regions and channel patterns indicative of field effect transistor (FET) channels from the mask layout patterns;

a second step of extracting contact relations between the resistive area patterns and the channel patterns; and, a third step of calculating a first equivalent resistance between a contact hole provided on a first diffused region of a resistive area pattern and a first FET having a channel pattern in contact with the first diffused region, and calculating a second equivalent resistance between the contact hole and a second FET having a channel pattern in contact with the first diffused region, the calculations being executed under a constraint that a first side formed where the channel pattern of the first FET makes contact with a second diffused region of the first FET, serving as a drain or source region thereof, has an equal potential to a second side formed where the channel pattern of the second FET makes contact with a second diffused region of the second FET serving as a drain or source region thereof, where each of the first and second channel patterns is formed in contact with a common resistive area pattern, namely in a case where the first diffused region of the first FET is used as the first diffused region of the second FET servicing as a drain or source region thereof, wherein the third step further comprises the sub-steps of:

calculating a first resistance value indicative of an equivalent resistance between the contact hole and the first side, and calculating a second resistance value indicative of an equivalent resistance between the contact hole and the second side, using the resistive area pattern, the first FET channel pattern, the second FET channel pattern, a sheet resistance of the first diffused region and a sheet resistance of each of the channels of the first and second FETs excited to ON-states; and, calculating a third resistance value indicative of an equivalent resistance of the channel pattern of the first FET and a fourth resistance value indicative of an equivalent resistance of the channel pattern of the second FET, using the length and width of each of the channel patterns of the first and second FETs, and calculating a difference between the first and third resistance values to obtain an equivalent resistance between the contact hole and the channel pattern of the first FET, and calculating a difference between the second and fourth resistance values to obtain an equivalent resistance between the contact hole and the channel pattern of the second FET.

5. The circuit extraction method according to claim 4 wherein the third step comprises sub-steps of:

dividing each of the resistance area patterns, the first channel pattern, and the second channel pattern into a plurality of rectangles;

converting each of the rectangles into an equivalent resistive element;

connecting resistive elements thus obtained to each other forming nodes in accordance with the positional relation between the rectangles;

uniting the nodes of resistive elements corresponding to the first side, and the nodes of into first and second terminals respectively, the nodes resistive elements corresponding to the second side, corresponding to the first and second sides having the same potential;

specifying a connection node of a resistive element, converted from a rectangle located nearest to the contact hole, as a third terminal; and, calculating a resistance between the third terminal and the first terminal and a resistance between the third terminal and the second terminal, to obtain first and second resistance values, respectively.

6. A circuit extraction apparatus for determining an equivalent circuit of a semiconductor device, including field effect transistors (FETs), the equivalent circuit useful as input data of a circuit simulator using mask layout patterns of the semiconductor device, for simulating an operation of the semiconductor device, the circuit extraction apparatus comprising:

a first extracting means for extracting resistive area patterns indicative of diffused regions and channel patterns indicative of channels of FETs from the mask layout patterns;

a second extracting means for extracting contact relations between the resistive area patterns and the channel patterns; and, a calculating means for calculating a first equivalent resistance between a contact hole, provided on a diffused region, and a first FET, whose channel pattern is formed in contact with the diffused region, and for calculating a second equivalent resistance between the contact hole and a second FET, whose channel pattern is formed in contact with the diffused region of the first FET serving as a drain or source region thereof, and each second side where the channel pattern of the second FET is formed in on a resistive area pattern, wherein each first side, where the channel pattern of the first FET is formed in contact with a second diffused region of the first FET serving as a drain or source region thereof, and each second side where the channel pattern of the second FET is formed in contact with a second diffused region of the second FET serving as a drain or source region thereof, has a uniform potential, the potential of the first side is equal to the potential of the second side, and wherein each of the first channel pattern and each second channel pattern is formed in contact with a common resistive area pattern, the first diffused region of the first FET being used as a first diffused region of the second FET serving as a drain or source region thereof, wherein the third means further comprises:

a means for calculating a first resistance value indicative between of an equivalent resistance between the contact hole and the first side, and for calculating a second resistance value indicative of an equivalent resistance between the contact hole and the second side, using the resistive area pattern, the first and second channel patterns, sheet resistance of the first diffused region and sheet resistance of each of the channels of the first and second FETs excited to ON-states; and, a means for calculating a third resistance value indicative of an equivalent resistance of the channel pattern of the first FET and a fourth resistance value indicative of an equivalent resistance of the channel pattern of the second FET, using the length and width of each of the channel patterns of the first and second FETs, and calculating a difference between the first and third resistance values to obtain an equivalent resistance between the contact hole and the channel pattern of the first FET, and calculating a difference between the second and fourth resistance values to obtain an equivalent resistance between the contact hole and the channel pattern of the second FET.

* * * * *

UNITED STATES PATENT AND TRADEMARK OFFICE
CERTIFICATE OF CORRECTION

PATENT NO. : 4,939,681

DATED : July 3, 1990

INVENTOR(S) : Goichi Yokomizo, et al.

It is certified that error appears in the above-identified patent and that said Letters Patent is hereby corrected as shown below:

Claim 5, column 11, lines 5-7, please delete "into first and second terminals respectively, the nodes resistive elements corresponding to the second side," and insert therefor --resistive elements corresponding to the second side, into first and second terminals respectively, the nodes--.

Signed and Sealed this

Seventeenth Day of September, 1991

*Attest:*

HARRY F. MANBECK, JR.

*Attesting Officer*  *Commissioner of Patents and Trademarks*